United States Patent [19]

Ogami et al.

[11] Patent Number: 5,432,673
[45] Date of Patent: Jul. 11, 1995

[54] ELECTRONIC APPARATUS WITH STORING SECTION AND EJECTOR FOR STORING AND EJECTING CARD-LIKE ELECTRONIC MEMBER

[76] Inventors: Keizo Ogami; Kohei Wada, both of Intellectual Property Division, Kabushiki Kaisha Toshiba, 1-1 Shibaura 1-chome, Minato-ku, Tokyo 105, Japan

[21] Appl. No.: 195,701

[22] Filed: Feb. 14, 1994

Related U.S. Application Data

[62] Division of Ser. No. 960,590, Oct. 13, 1992, abandoned.

[30] Foreign Application Priority Data

Oct. 14, 1991 [JP] Japan .................. 3-264989

[51] Int. Cl.$^6$ .................. H05K 7/10; G06F 1/16; H01R 13/62
[52] U.S. Cl. .................. 361/684; 439/159
[58] Field of Search .................. 364/708.1; 439/152, 439/159, 160; 312/223.1, 223.2; 235/475, 479–486; 361/683, 684, 686, 725, 727, 737, 741, 754, 798, 835

[56] References Cited

U.S. PATENT DOCUMENTS

| | | |
|---|---|---|
| 4,002,892 | 1/1977 | Zielinski . |
| 4,652,976 | 3/1987 | Fushimoto . |
| 4,695,925 | 9/1987 | Kodai et al. . |
| 4,807,955 | 2/1989 | Ashman et al. . |
| 4,941,841 | 7/1990 | Darden et al. . |
| 5,234,351 | 8/1993 | Dixon .................. 439/160 |
| 5,315,478 | 5/1994 | Cadwell et al. .................. 361/684 |

FOREIGN PATENT DOCUMENTS

| | | |
|---|---|---|
| 58-66435 | 10/1981 | Japan . |
| 62-184686 | 2/1986 | Japan . |
| 62-184687 | 2/1986 | Japan . |
| 62-185293 | 2/1986 | Japan . |
| 63-39780 | 9/1986 | Japan . |
| 63-182078 | 5/1987 | Japan . |
| 63-183673 | 5/1987 | Japan . |
| 63-195457 | 6/1987 | Japan . |

*Primary Examiner*—Michael W. Phillips
*Attorney, Agent, or Firm*—Limbach & Limbach

[57] ABSTRACT

An electronic apparatus has a substantially rectangular box-like housing, having a top wall. A storing section is formed in the housing adjacent to the top wall of the housing and having an insertion opening in the housing. A card-like electronic member is detachably insertable into the storing section through the insertion opening in a card inserting direction. A plate like ejecting member is attached to an under side of the top wall of the housing and located above the storing section in the housing so as to be slidable in a direction parallel to the direction in which the electronic member is inserted into the storing section. An operation member on the ejecting member projects outside the housing through an opening formed in the top wall of the housing. A pressing claw on the ejecting member abuts against an inner inserted end of the electronic member when the electronic member is inserted into the storing section, and the pressing claw pushes the electronic member outside the housing, through the insertion opening, when the ejecting member is moved toward the insertion opening.

12 Claims, 9 Drawing Sheets

ELECTRONIC APPARATUS WITH STORING SECTION AND EJECTOR FOR STORING AND EJECTING CARD-LIKE ELECTRONIC MEMBER

This is a divisional o application Ser. No. 07/960,590, filed Oct. 13, 1992, now abandoned.

BACKGROUND OF THE INVENTION

1. Field of the Invention

The present invention relates to a portable electronic apparatus such as personal computers of the lap-top type and, more particularly, an electronic apparatus provided with a storing section for storing a card-like electronic member

2.

Description of the Related Art

Recently, a plurality of portable electronic apparatuses such as personal computers of book-type and lap-top types are on the market. Some of them have provision to receive a card-like electronic member, such as a high capacity memory card. The housing of such a computer includes a storing section for storing the card-like electronic member and an insertion opening through which the memory card is inserted.

In order to eject the received memory card, the computer further comprises a link mechanism arranged in the housing and an operation button attached, for example, to a side wall of the housing. The link mechanism is structurally complex and requires a large space within the computer body.

SUMMARY OF THE INVENTION

The present invention is therefore intended to eliminate the above-mentioned drawbacks an its object is to provide a compact electronic apparatus which is capable of receiving a card-like electronic member and is simple in structure.

In order to achieve the object, an electronic apparatus according to the present invention comprises a substantially rectangular box-like housing, having a top wall. A storing section is formed in the housing adjacent to the top wall of the housing and having an insertion opening in the housing. A card-like electronic member is detachably insertable into the storing section through the insertion opening in a card inserting direction. A plate like ejecting member is attached to an under side of the top wall of the housing and located above the storing section in the housing so as to be slidable in a direction parallel to the direction in which the electronic member is inserted into the storing section. An operation member on the ejecting member projects outside the housing through an opening formed in the top wall of the housing. A pressing claw on the ejecting member abuts against an inner inserted end of the electronic member when the electronic member is inserted into the storing section, and the pressing claw pushes the electronic member outside the housing, through the insertion opening, when the ejecting member is moved toward the insertion opening.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1 through 12 show a personal computer according to an embodiment of the present invention, in which FIG. 1 is a perspective view showing the computer;

FIG. 2 is a perspective view showing the structure of a battery pack and a battery pack storing section;

FIG. 3 is a perspective view showing a part of the computer housing together with a hard disk drive pack and a memory card which are to be set in the computer housing;

FIG. 4 is a sectional view showing a part of a function label and a holder groove enlarged;

FIG. 5 is a sectional view of a HDD holder taken along a line V—V in FIG. 3;

FIG. 6 is an exploded perspective view showing the HDD holder;

FIG. 7 is a front view showing the HDD holder in a state wherein a slider is moved to its retreated position and a rear cover is removed;

FIG. 8 is a front view showing the HDD holder in a state wherein the slider is moved to its latched position and the rear cover is removed;

FIG. 9 is an exploded perspective view showing a part of the personal computer, including a memory card storing section and an ejecting plate;

FIG. 10 is a perspective view showing the memory card storing section with a memory card inserted, but an upper case is removed;

FIG. 11 is a sectionall view taken along a line XI—XI in FIG. 9; and

FIG. 12 s a sectional view taken along a line XII—XII in FIG. 9.

DETAILED DESCRIPTION OF THE PREFERRED EMBODIMENTS

An embodiment of the present invention will be described in detail with reference to the accompanying drawings.

Figure 1:
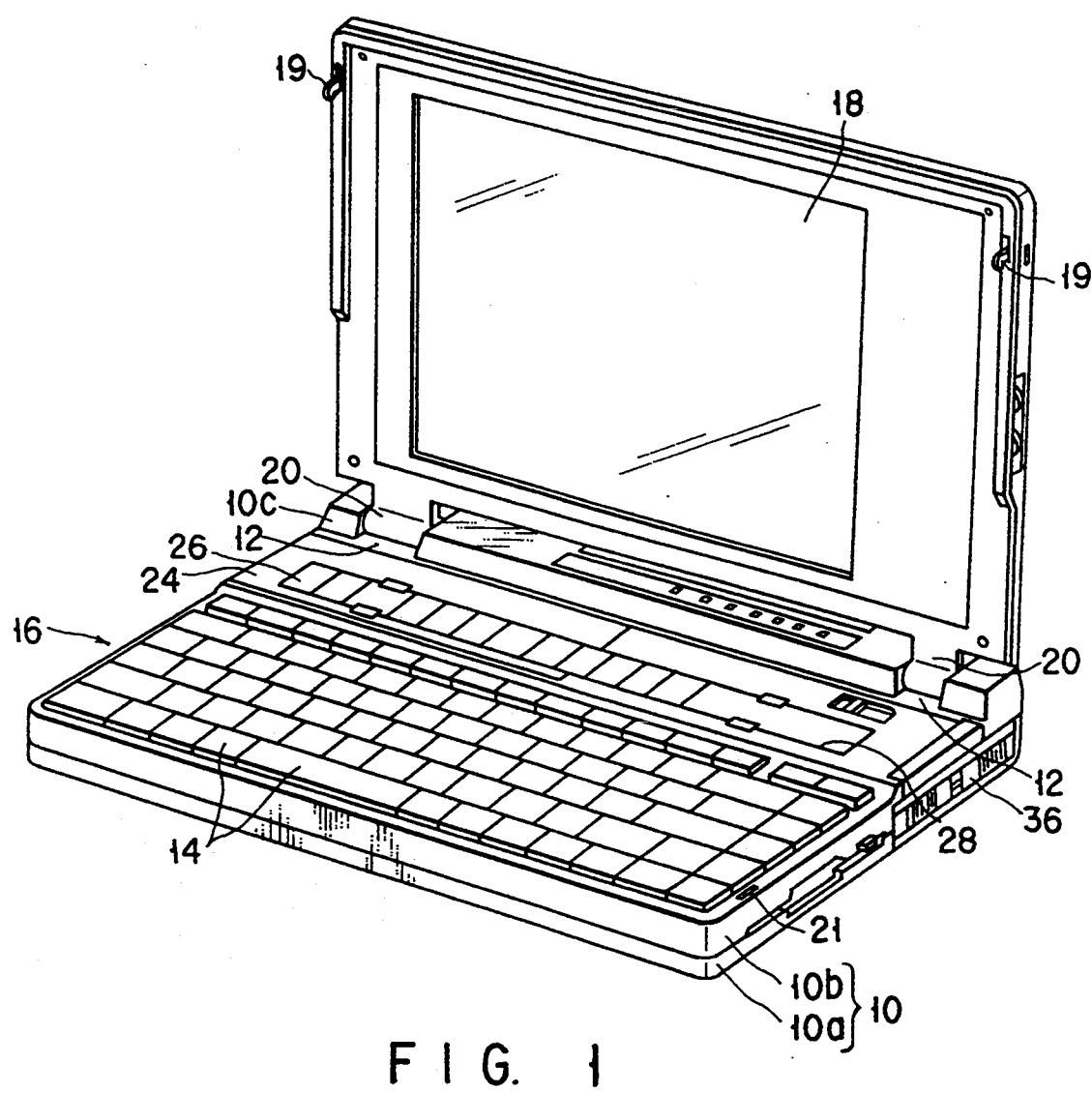

As shown in FIG. 1, a lap-top type personal computer according to an embodiment of the present invention includes a flat rectangular housing 10 which comprises a combination of upper and lower cases 10a and 10b both made of synthetic resin. A rear end portion of the upper surface of the upper case 10b projects upward and constitutes a projected portion 10c which extends in the width direction of the housing 10. The projected portion 10c has a pair of recesses 2 separated from each other in the width direction of the housing 10. A keyboard 16 having a plurality of keys 14 is attached to the upper case 10a and the keys 14 are exposed outside through an opening which is formed at the front top portion of the upper case 10b.

A display unit 18 of the flat type is rotatably mounted on the housing 10. The display unit 18 is shaped like a rectangle and a pair of legs 20 serving as pivotal portions project from the lower end of the display unit 18. These legs 20 are positioned in the recesses 12 of the projected portion 10c and rotatably attached to the housing 10 by means of hinges (not shown). The display unit 18 therefore is rotatable between an opened position where the keyboard 16 is exposed to enable the computer to be operated, as shown in FIG. 1, and a closed position where the keyboard 16 is covered by the display unit. When the display unit 18 is closed, its top face becomes flush with the top face of the projected portion 10c. Latch claws 19 are provided at upper right and left end portions of the display unit 18. These latch claws 19 are engaged with latch holes 21 on the front top of the upper case 10b to lock the display unit 18 in the closed position.

Figure 2:
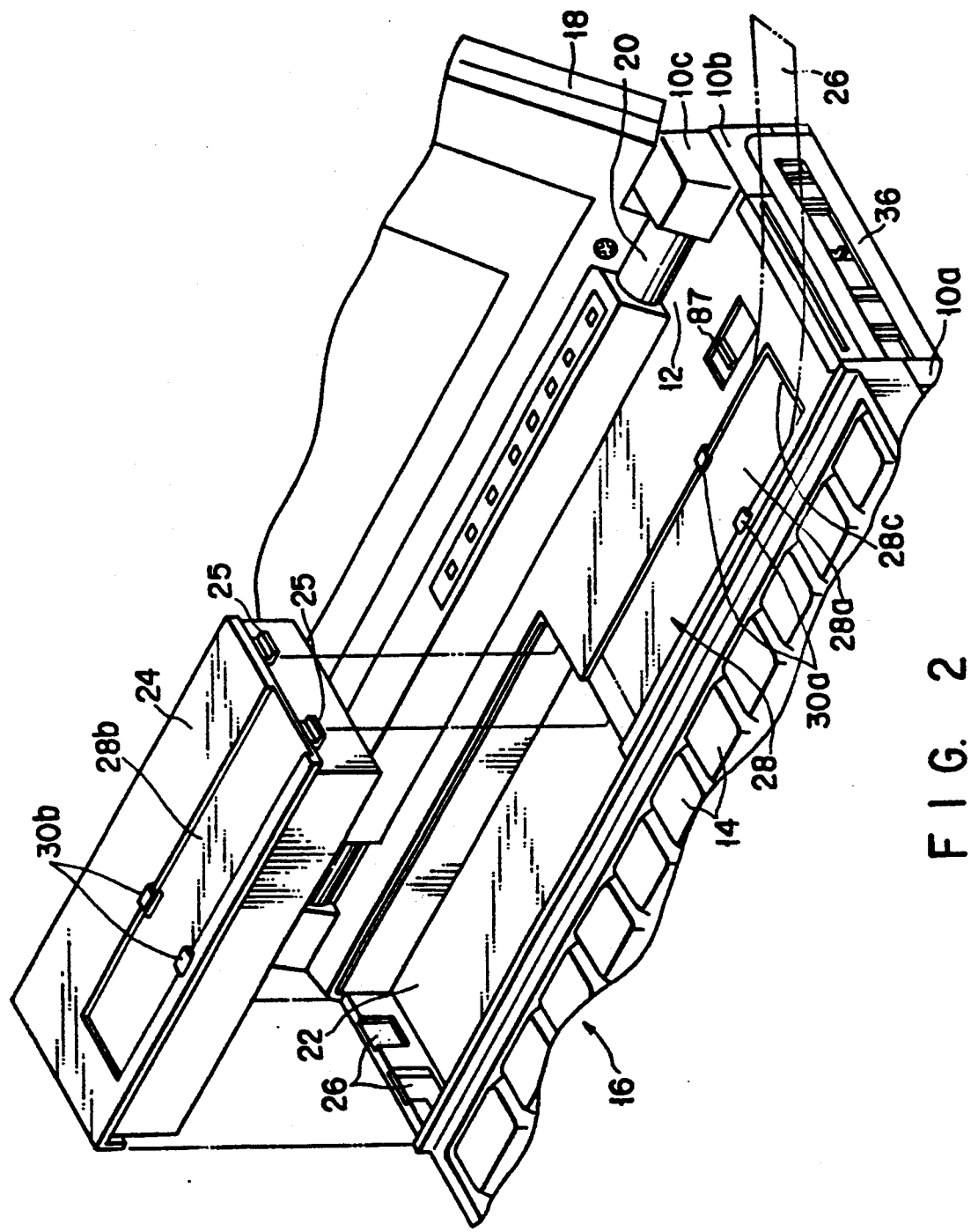

As shown in FIGS. 1 and 2, the housing 10 has a battery pack storing portion 22 formed of a rectangular recess 22 which is open to the top face of the upper case 10b between the keyboard 16 and the projected portion 10c. The storing section 22 extends from the left side to the center of the housing 10. A battery pack 24 is detachably fitted in the storing section 22.

The battery pack 24 is shaped like a rectangular box having same dimension as that of the battery pack storing section 22. A pair of projections 25 project from the right side of the battery pack 24 and fitted into engaging holes (not shown) of the upper case 10b. Terminals (not shown) are arranged on the left side of the battery pack 24 to contact receiving terminals 26 which are provided on the left side of the battery pack storing section 22. When the battery pack 24 is set in the storing section 22, its top face is in flash with that of the upper case 10b to form a part of the top of the housing 10. It can be held in the battery pack storing section 22 by a lock mechanism (not shown).

As described above, the battery pack 24 is located between the keyboard 16 and the supports or legs 20 of the display unit 18. When the display unit 18 is opened, therefore, setting and releasing of the battery pack 24 into and from the battery pack storing section 22 of the housing 10 cannot be disturbed by the display unit 18, thereby enabling the battery pack 24 to be easily set into and detached from the storing section 22 at the front side of the housing 10. In addition, the legs 20 of the display unit 18 can be arranged on the rear end of the housing 10, so that the size of the display unit 18 can be made as large as the housing 10.

When the display unit 18 is rotated to its closed position, the battery pack 24 is covered by the display unit 18. Even when the lock mechanism for the battery pack 24 is wrongly unlocked during the computer is carried with the display unit 18 being closed, therefore, the battery pack 24 can be prevented from being removed from the housing 10.

A function label 26 for showing functions of function keys of the keyboard 16 is mounted, adjacent to the keyboard 16, on the top face of the upper case 10b. It is made of synthetic resin and shaped like a strip extending along the whole length of the housing 10 in the width direction thereof.

Figure 4:
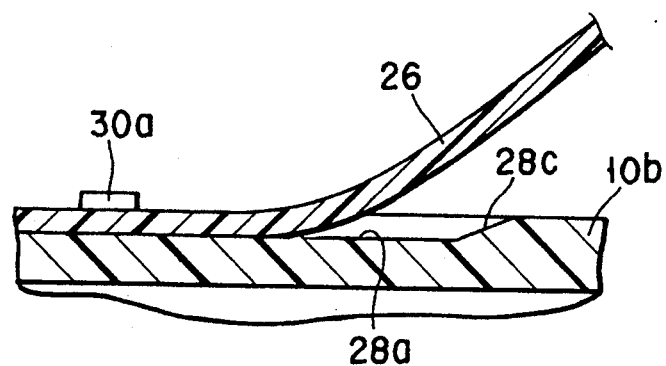

The function label 26 is fitted in a holding groove 28 which is formed on the top face of the upper case 10b and has the same shape and dimension as those of the function label 26. The holding groove 28 extends onto the battery pack 24. Specifically, the groove 28 is comprised of a right half (or first portion) 28a formed on the top face of the upper case 10b and a left half (or second portion) 28b formed on the top face of the battery pack 24. When the battery pack 24 is fitted in the battery pack storing section 22, therefore, the left half 28b is combined with the right one 28a to form the holding groove 28. The function label 26 is held in the holding groove 28 by a pair of first holding claws 30a projecting from the top face of the upper case 10b toward the right half 28a of the holding groove 28 and by a pair of second holding claws 30b projecting from the top face of the battery pack 24 toward the left half 28b thereof.

when the battery pack 24 is in the battery pack storing section 22 of the housing 10, the left half of the function label 26 is on the battery pack 24, as shown in FIG. 1. When the battery pack 24 is to be detached from the pack storing section 22, therefore, the function label 26 disturbs this detaching of the battery pack 24. In order to overcome this, a right end edge 28c of the holding groove 28 which is in opposite to the battery pack 24 is tilted relative to the bottom of the holding groove 28, as shown in FIG. 4. When the battery pack 24 is to be fitted into and detached from the pack storing section 22, therefore, the function label 26 can be easily pulled out of the holding groove 28 from the right end 28c thereof and retreated from the battery pack 24, as shown by a two-dot and dash line in FIG. 2. The battery pack 24 can be therefore fitted into and detached from the pack storing section 22 without being disturbed by the function label 26.

Figure 3:
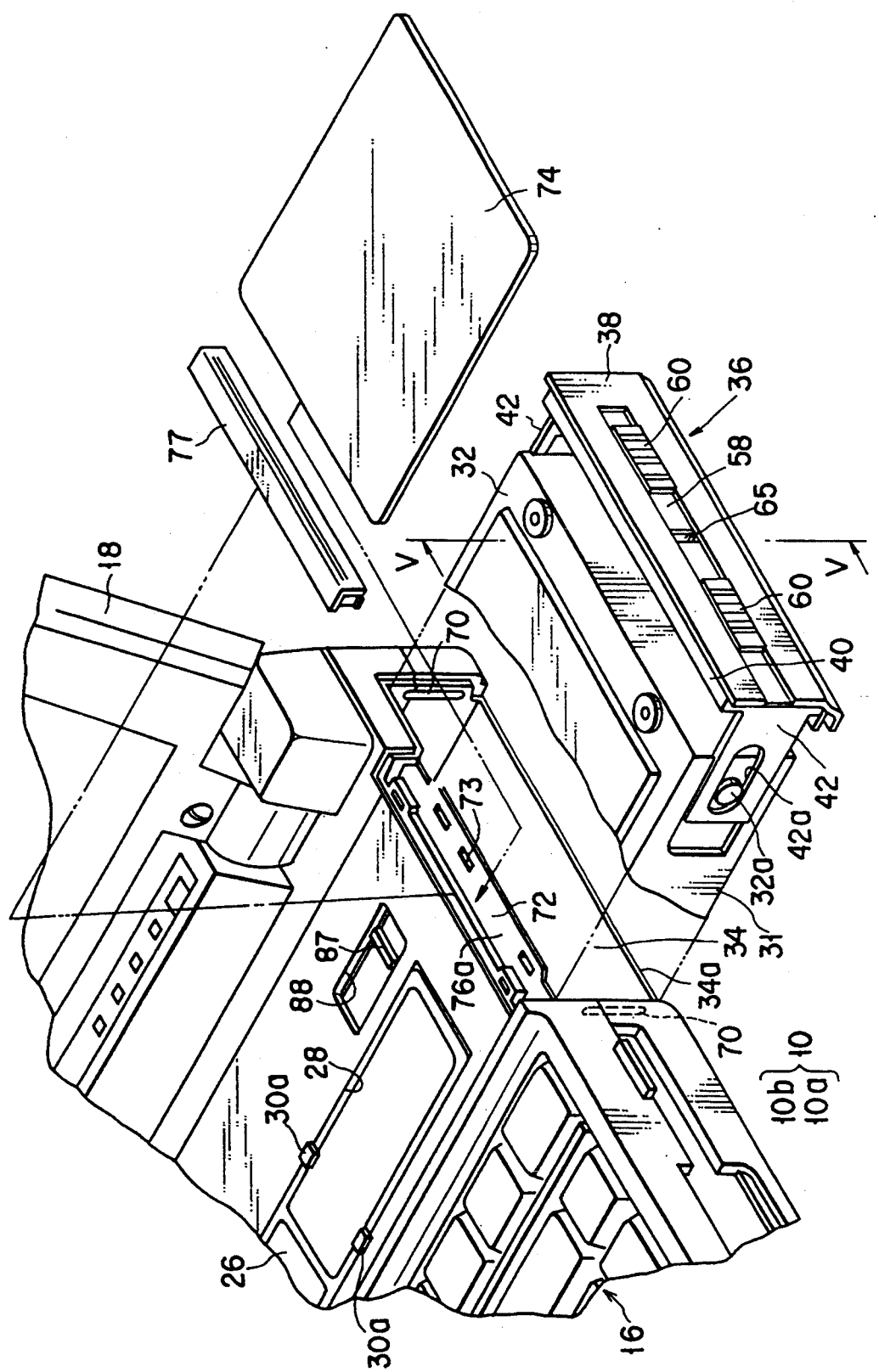

As shown in FIG. 3, in the housing 10 is formed a storing section 34 for storing a hard disk drive (which will be hereinafter referred to as HDD) pack 32, which has a box-shaped case 32, and a HDD holder 36. The storing section 34 is arranged side by side with the battery pack storing section 22 and provided with an insertion opening 34a at the right rear side of the housing 10. As shown in FIGS. 1 and 2, the opening 34a of the storing section 34 is usually closed by the HDD holder 36. These HDD pack and holder 32 and 36 constitute a detachable unit of the present invention.

As shown in FIGS. 3 and 5 through 7, the HDD holder 36 includes a plate-like holder body 38 having same shape as that of the opening 34a of the storing section 34, and a rear cover 40 fixed to the rear side of the holder body 38 and having substantially same dimension as that of the holder body 38. The rear cover 40 has a pair of parallel holder arms 42 extending backwards and perpendicular to the holder body 38 from both ends of the rear cover 40. These paired holder arms 42 are spaced apart from each other by a distance substantially equal to the width of the case 31 of the HDD pack 32. Each of the holder arms 42 has a slit 42a extending in the longitudinal direction of the arm 42.

The rear cover 40 includes a pair of through-holes 43 at upper both ends thereof, a pair of engagement holes 44 at the top thereof, and plural projections 45 at the bottom thereof. On the other hand, the holder body 38 includes a pair of threaded bosses 46, a pair of projections 47 corresponding to the engagement holes 44 of the rear cover 40, and plural engagement holes 48 corresponding to the projections 45 of the rear cover 40. The rear cover 40 is therefore fixed to the holder body 38 in such a way that screws 49 are screwed into bosses 46 of the holder body 38 through the through holes 43 while engaging the projections 45 with the engagement holes 48 of the holder body 38 and the projections 47 of the holder body 38 with the engagement holes 44. 10 A pair of sliders 50 and a lock plate 52 are slidably arranged between the holder body 38 and the rear cover 40. Each of the sliders 50 is slidably guided in the longitudinal direction of the holder body 38 or in a direction parallel to the top face of the upper case 10b by a guide rib 54 on the rear side of the holder body 38. A latch claw 56 made of metal is fixed to each of the sliders 50.

Figure 7:
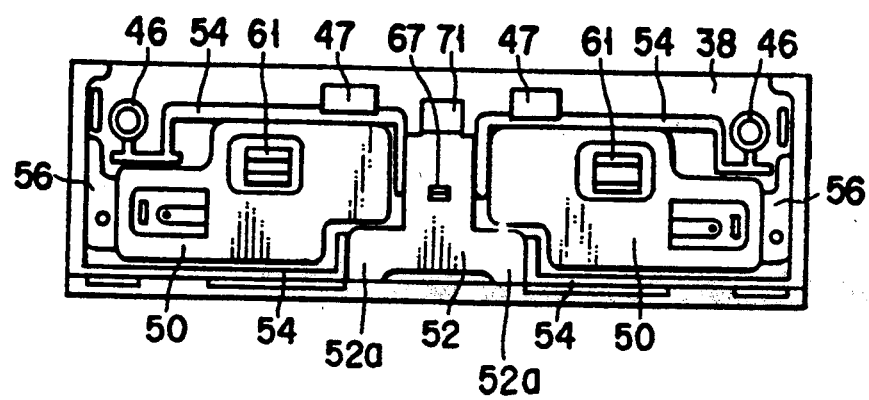
Figure 8:
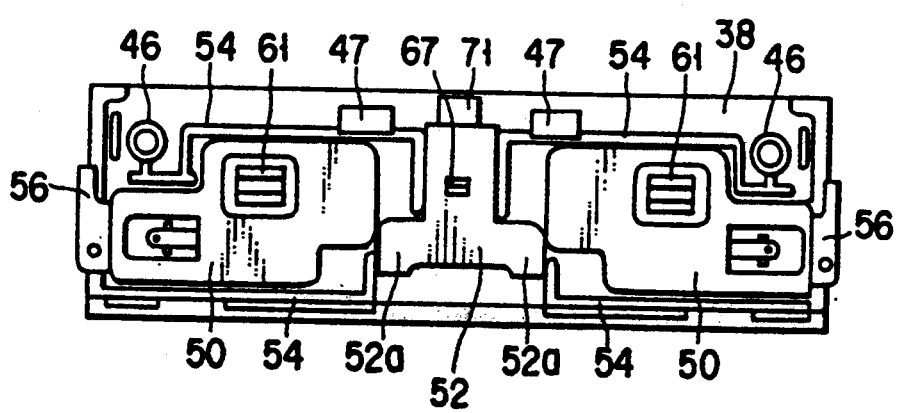

Each slider 50 can slide between a retreated position where its latch claw 56 is retreated between the holder body 38 and the rear cover 40, as shown in FIG. 7, and a latched position (or engaged position) where its latch claw 56 projects from the side rim of the holder body 38, as shown in FIG. 8. The sliders 50 and their latch claws 56 serve as engaging members of the present invention.

A guide groove 58 is formed on the front side of the holder body 38, extending in the longitudinal direction of the body 38. A pair of operation knobs 60 are slidably fitted in the guide groove 58. Each of the operation knobs 60 includes an engaging claw 61 projecting backwards passing through an opening 62 of the holder body 38 and engaged with an engagement hole 63 of the corresponding slider 50. The operation knobs 60 are thus connected to their corresponding sliders 50 and can slide together with them. By sliding the operation knobs 60, therefore, it is possible to slide the sliders 50 from the front side of the holder body 38.

The lock plate 52 is arranged between the paired sliders 50 and guided by the guide ribs 54 to be slidable between a releasing position shown in FIG. 7 and a locking position shown in FIG. 8 in a direction perpendicular to the direction in which the sliders 50 slide. The lock plate 52 has a pair of projections 52a projecting from its bottom end in directions opposite to each other and it is therefore shaped like a fallen T. The lock plate 52 also has an engaging projection 71 projecting upwards from its top. When the lock plate 52 is in its releasing position, the projections 52a are positioned lower than inner ends of the sliders 50 and shifted from them to allow the sliders 50 to freely slide. When the sliders 50 are moved to the latched positions and the lock plate 52 is moved to the locking position, the projections 52a comes between the inner ends of the paired sliders 50 and prevent the sliders 50 from moving to the retreated positions. The sliders can be thus locked at their latched positions. These sliders 50 and the lock plate 52 form a holding mechanism for holding the detachable unit in the storing section 34.

Figure 5:
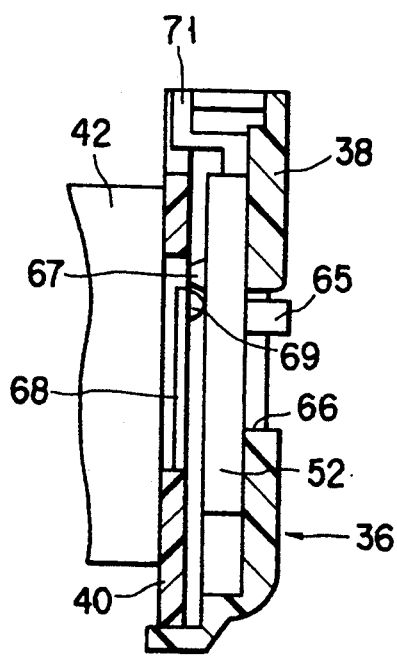

As shown in FIGS. 3 and 5, an operation projection 65 protrudes from the front side of the lock plate 52. The operation projection 65 projects outside the holder body 38, passing through an opening 66 of the body 38. The lock plate 52 can thus slide between its releasing and locking positions by the operation projection 65 on the front side of the holder body 38.

Figure 6:
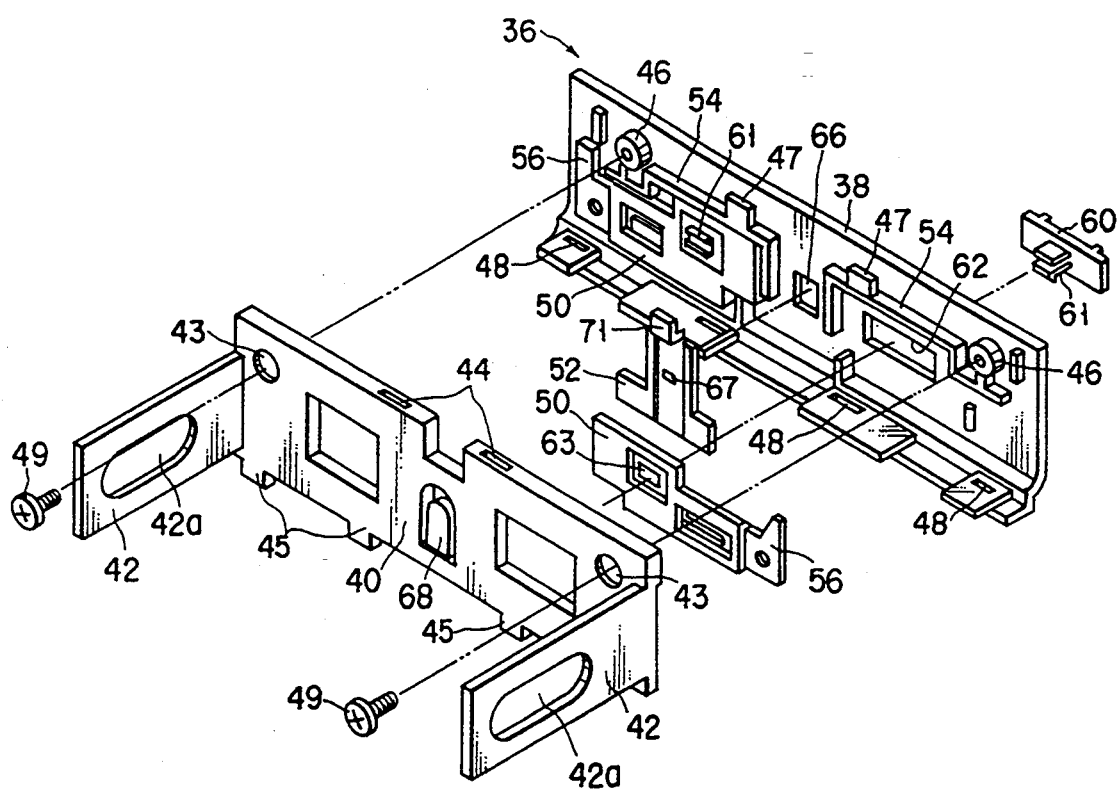

As shown in FIGS. 5 and 6, an engaging projection 67 projects from the rear side of the lock plate 52. The rear cover 40 has an elastic cantilevered piece 68 which is formed by cutting a part of the rear cover 40 and which is opposed to the lock plate 52. A protrusion 69 projects from a free end of the elastic cantilevered piece 68 toward the lock plate 52. When the lock plate 52 is moved from its releasing position to its locking position, the engaging projection 67 abuts against the projection 69 of the piece 68 to elastically deform the piece 68 in a direction in which the piece 68 is separated from the lock plate 52. When the lock plate 52 comes to its locking position, causing its projection 67 to slide upward over the protrusion 69 of the piece 68, the cantilevered piece 68 returns to its initial position due to its elasticity. The protrusion 69 is thus struck against the bottom rim of the engaging projection 67, so that the lock plate 52 can be elastically held in its locking position shown in FIG. 5. When the lock plate 52 is in its releasing position, the protrusion 69 is struck against the top rim of the projection 67 to elastically hold the lock plate 52 in its releasing position.

When the HDD pack 32 is to be set in the storing section 34 of the housing 19, as shown in FIG. 3, the HDD holder 36 is attached to the HDD pack 32, holding one end portion of the HDD pack 32 between the holder arms 42 thereof. Engaging projections 32a (only one of them is shown in FIG. 3) projecting from both sides of this end portion of the HDD pack 32 are engaged with their corresponding slits 42a of the holder arms. In this state, the paired sliders 50 of the HDD holder 36 are set in their retreated positions and the lock plate 52 is in its releasing position.

The other end portion of the HDD pack 32 is then inserted into the storing section 34 through the insertion opening 34a and the HDD holder 36 is pushed together with the HDD pack 32 into the opening 34a. When the holder body 38 of the HDD holder 36 is fitted in the opening 34a, the paired sliders 50 are slid to their latched positions by the operation knobs 61. The latch claws 56 thus project from the side rims of the holder body 38 and fitted into latched holes 70 of the housing 10. The lock plate 52 is then moved to its locking position by the operation projection 65 so that the paired sliders 50 are locked in their latched positions. When the lock plate 52 is moved to its locking position, the engaging projection 71 of the lock plate 52 is engaged with an engaging hole 73 formed in a partition wall 72 of the housing 10 which will be described later.

The HDD holder 36 is thus attached to the housing 10, keeping the opening 34a of the storing section 34 closed by the holder body 38. The HDD pack 32 is set at a certain position in the storing section 34. The holder body 38 forms, under this state, a part of the side wall of the housing 10 and it is exposed outside, as shown in FIGS. 1 and 2.

when the HDD pack 32 is to be detached from the housing 10, the above-described processes are reversely conducted.

When the HDD holder 36 arranged as described above is kept attached to the housing 30, its holder body 38 forms a part of the side face of the housing 10. This makes it unnecessary to use a cover for covering the front side of the holder body 38, thereby enabling the number of parts used to be reduced and the housing 10 to be smaller-sized. When the operation knobs 60 are exposed outside together with the holder body 38, there is fear that they are wrongly pushed. However, the paired sliders 50 are locked in their latched positions by the lock plate 52. Their moving can be therefore prevented even when the operation knobs 61 are wrongly pushed. Thus, the detachable unit including the HDD pack and holder 32 and 36 can be stably set in the storing section 34 without undesirably getting out of the housing 10.

Figure 9:
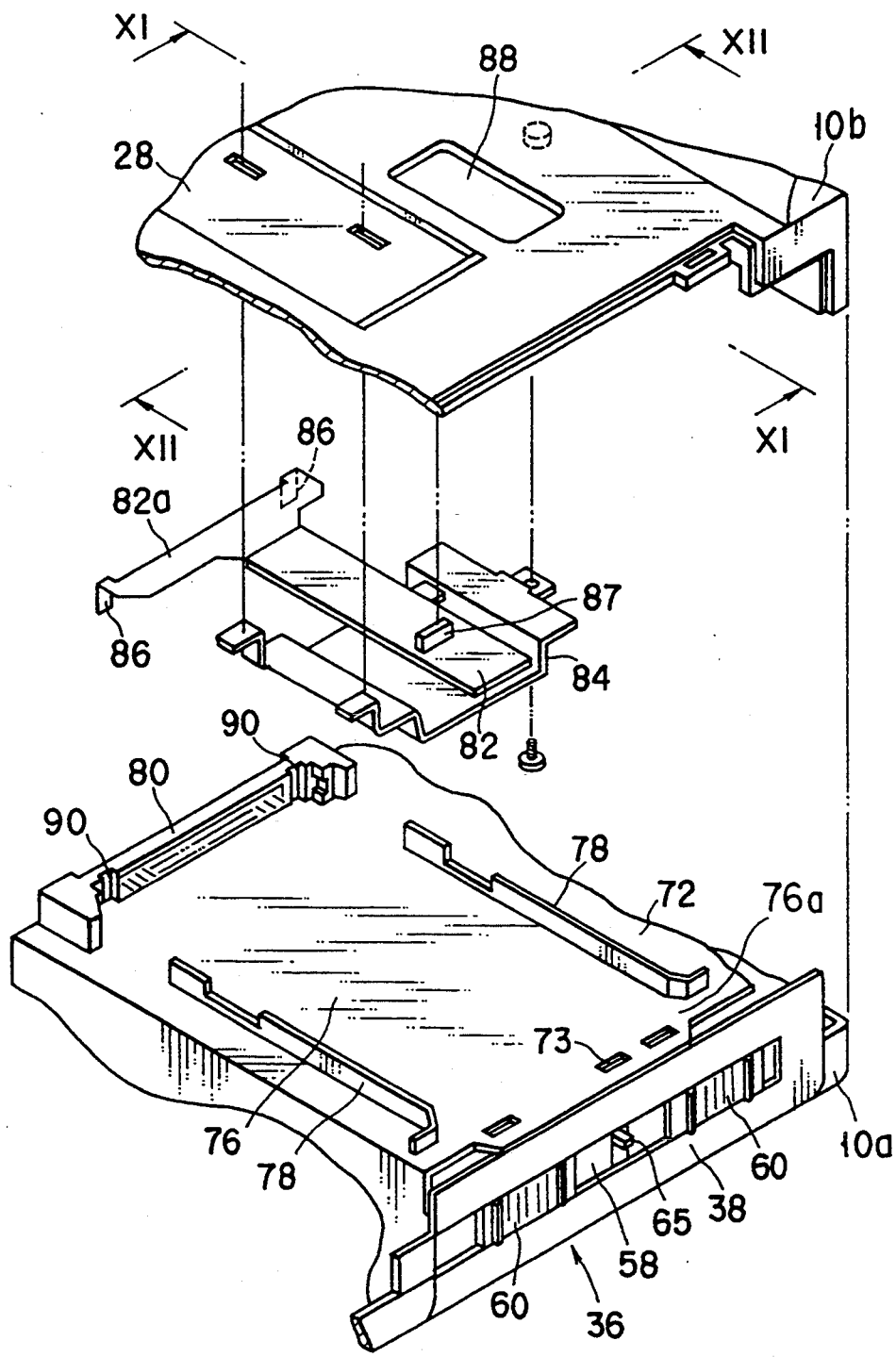
Figure 10:
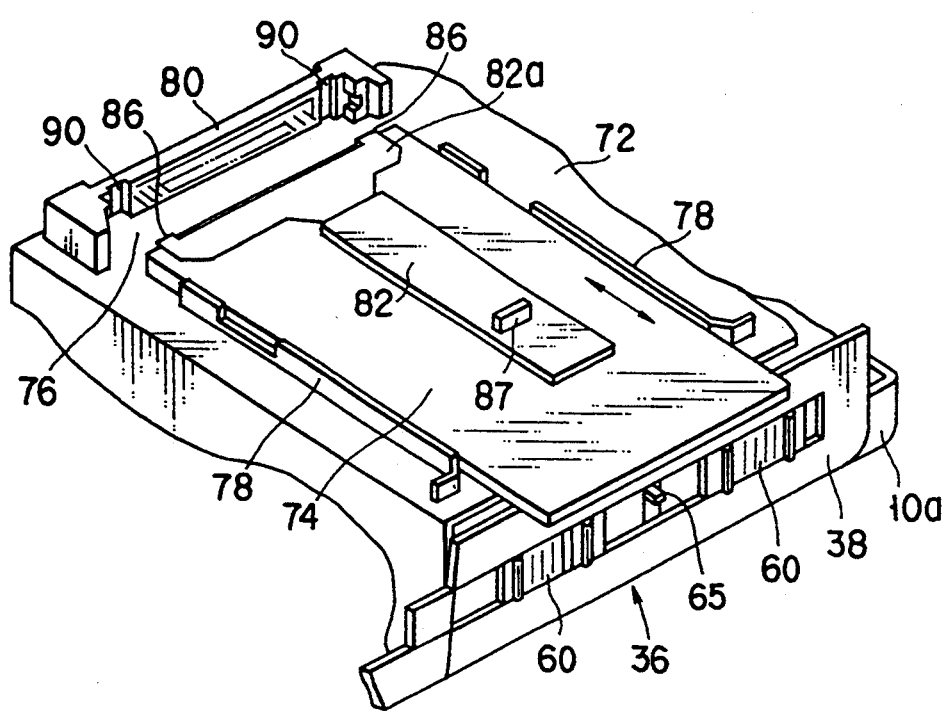
Figure 11:
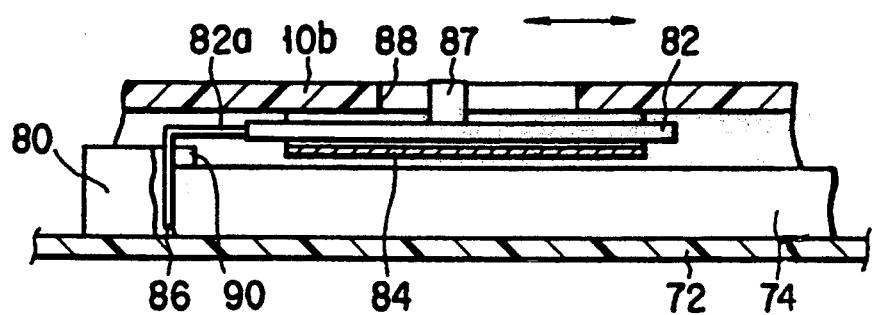
Figure 12:
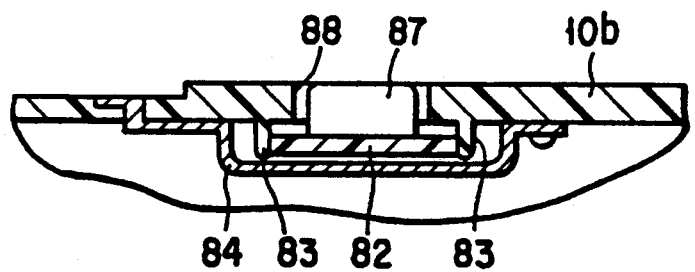

As shown in FIGS. 3, 9 and 10, a storing section 76 for storing a card-like electronic member such as a memory card 74 is formed between the partition wall 72 of the housing 10, which forms the top of the HDD pack storing section 34, and the top wall of the upper case 10b. The memory card storing section 76 includes an insertion opening 76a opened at the top and the side faces of the housing 10. This insertion opening 76a is positioned on the opening 34a of the HDD pack storing section 34 and usually closed by a cover 77.

A pair of guide ribs 78 are formed on the top face of the partition wall 72, extending from the insertion opening 76a into the housing 10. They are opposed to each other and separated from each other by a distance substantially equal to the width of the memory card 74. A connector 80 to which terminals (not shown) of the memory card 74 are connected is fixed on the top face of the partition wall 72. This connector 80 is positioned at the inner end portion of the storing section 76.

As shown in FIGS. 9 through 12, an ejecting plate 82 for ejecting the memory card 74 out of the storing section 76 is attached to the underside of the top wall of the upper case 10b and located above the storing section 76. Specifically, the ejecting plate 82 is slidably guided, by guide ribs 83 projecting from the underside of the top wall of the upper case 10b, in a direction parallel to the card inserting and ejecting direction. It is also held on the underside of top wall of the upper case 10b by a holding plate 84, which is attached to the underside of the top wall of the upper case 10b, covering a part of the ejecting plate 82.

A metal plate 82a is attached to that inner end of the ejecting plate 82 which is opposed to the insertion opening 76a. The metal plate 82a has a pair of pressing claws 86 bent toward the partition wall 72 and these pressing claws 86 are separated from each other in the width direction of the memory card 74 and projecting into the storing section 76.

The ejecting plate 82 includes an operation knob 87 projecting toward the upper case 10b and positioned in an opening or aperature 88 of the upper case 10b. The ejecting plate 82 can be therefore operated from outside the housing 10 by the operation knob 87.

When the memory card 74 is inserted into the storing section 76 through the insertion opening 76a by a certain length, that end rim of the memory card 74 which is inserted into the storing section 76 abuts against the pressing claws 86 of the ejecting plate 82. When the memory card 74 is further inserted into the storing section 76 until its terminals are connected to the connector 80, the ejecting plate 82 is also slid together with the memory card 74. The pressing claws 86 are then received into their corresponding recesses 90 of the connector 80.

when the memory card 74 is to be ejected from the storing section 76, the ejecting plate 82 is slid toward the insertion opening 76a through the operation knob 87. The inner end rim of the memory card 74 is thus caught by the pressing claws 86 of the ejecting plate 82 and the memory card 74 is pushed out through the insertion opening 76a, associating with ejecting plate 82. When the memory card 74 is pushed out through the opening 76a by a certain length, it is pulled out of the storing section 76 by the operator.

As described above, the ejecting plate 82 is flat and it is positioned close to the underside of the upper case 10b. In addition, it has dimensions smaller than the dimensions of storing section 76. Further, the ejecting plate 82 is arranged in the storing section 76 and it is allowed to move in the storing section 76. Still further, the ejecting plate 82 can be directly operated from outside the housing 10 by the operation knob 87 and this makes it unnecessary to use a link mechanism and another operation button attached to the side wall of the housing. The ejection mechanism realized by this ejecting plate can be made more compact and simpler in structure to occupy a smaller space.

The present invention is not limited to the personal computers but it may be applied to other electronic apparatus such as the word processor. The card-like electronic parts cannot be limited to the memory card but it may be a modem card.

Although the detachable unit has included the HDD pack and the HDD holder detachably attached to the HDD pack in the above-described embodiment, the HDD holder may be omitted. In this case, the sliders (or engaging members) and the lock plate which constitute the holding mechanism will be attached directly to the case of the HDD pack. Further, the detachable unit is not limited to a combination of the HDD pack and holder, but a battery pack may be used.

Still further, the holding mechanism may be formed by single engaging member and a single lock member. Moreover, it may be arranged that an engaging member and a lock member of the holding mechanism are provided on the housing of the computer and that an engagement portion (or latch holes 70) for engaging with the engaging members is formed at the detachable unit.

It should be understood that other various changes and modifications can be made without departing from the spirit and scope of the present invention.

What is claimed is:
1. An electronic apparatus comprising:
a substantially rectangular box-like housing having a top wall;
a storing section formed in the housing adjacent to the top wall of the housing and having an insertion opening in the housing;
a card-like electronic member detachably insertable into the storing section through the insertion opening in a card inserting direction; and
a plate-like ejecting member attached to an under side of the top wall of the housing and located above the storing section in the housing so as to be slidable in a direction parallel to the direction in which the electronic member is inserted into the storing section, said ejecting member including an operation member projecting outside the housing through an opening formed in the top wall of the housing, and a pressing claw for abutting against an inner inserted end of the electronic member, when inserted into the storing section, and pushing the electronic member outside the housing through the insertion opening when the ejecting member is moved toward the insertion opening.

2. An electronic apparatus according to claim 1, wherein said housing includes a partition wall arranged in the housing to face the top wall substantially in parallel to the top wall, and a pair of guide ribs formed on the partition wall, facing each other with a predetermined distance therebetween and extending in the card inserting direction, the guide ribs, partition wall, a the top wall defining the storing section.

3. An electronic apparatus according to claim 2, wherein said housing includes a connector provided on the partition wall and electrically connected to the inner end of the electronic member when in the storing section.

4. An electronic apparatus comprising:
a housing having an outer wall;
a storing section formed in the housing adjacent to the outer wall of the housing and having an insertion opening in the outer wall;
a card-like electronic member detachably insertable into the storing section through the insertion opening in a card inserting direction; and
an ejecting member arranged in the storing section so as to be slidable between a first position and a second position, said ejecting member including a projecting portion projecting outside the housing through an aperture formed in the top of the outer wall of the housing, and a pressing portion for abutting against an inner inserted end of the electronic member, when inserted into the storing section, so that the ejecting member is moved to the first position by the inserted electronic member and for pushing the electronic member outside the housing through the insertion opening when the ejecting member is moved from the first position to the second position by movement of the projecting portion.

5. An apparatus according to claim 4, wherein said top of said outer wall of the housing includes a top wall in which said aperture is formed.

6. An apparatus according to claim 5, wherein said housing includes a partition wall arranged in the housing to face the top wall substantially in parallel to the top wall, and a pair of guide ribs formed on the partition wall, facing each other with a predetermined distance therebetween and extending in the card inserting direction, the guide ribs, the partition wall and top wall defining the storing section.

7. An apparatus according to claim 6, wherein said housing includes a connector provided on the partition wall and electrically connected to the inner end of the electronic member when in the storing section.

8. An apparatus according to claim 6, wherein said housing includes a bottom wall, and which further comprises a detachable unit detachably arranged between the bottom wall and the partition wall.

9. An apparatus according to claim 8, wherein said detachable unit includes a hard disc drive.

10. An apparatus according to claim 8, wherein said detachable unit includes a battery pack.

11. An apparatus according to claim 4, which further comprises input means provided on a top face of the housing, for inputting data.

12. An apparatus according to claim 11, which further comprises a display unit having supports attached to the top face of the housing and mounted on the housing through the supports to be rotatable, and wherein said storing portion is located between the input means and the supports of the display unit.

* * * * *

UNITED STATES PATENT AND TRADEMARK OFFICE
CERTIFICATE OF CORRECTION

PATENT NO. : 5,432,673
DATED : July 11, 1995
INVENTOR(S) : Ogami et al

It is certified that error appears in the above-indentified patent and that said Letters Patent is hereby corrected as shown below:

On the title page, item [73] Assignee: Kabushiki Kaisha Toshiba
please add                              Kanagawa-Ken, Japan Signed and Sealed this Seventh Day of May, 1996

Attest:

BRUCE LEHMAN

*Attesting Officer*    *Commissioner of Patents and Trademarks*